(12) United States Patent
Tirrell et al.

(10) Patent No.: US 6,791,841 B1
(45) Date of Patent: Sep. 14, 2004

(54) METHODS AND APPARATUS FOR MANAGING A SET OF CABLES

(75) Inventors: Paul T. Tirrell, Uxbridge, MA (US); Ralph L. Specht, Jr., Westborough, MA (US)

(73) Assignee: EMC Corporation, Hopkinton, MA (US)

( * ) Notice: Subject to any disclaimer, the term of this patent is extended or adjusted under 35 U.S.C. 154(b) by 3 days.

(21) Appl. No.: 10/318,949

(22) Filed: Dec. 13, 2002

(51) Int. Cl.⁷ .................................................. H05K 5/03
(52) U.S. Cl. ...................... 361/724; 361/725; 361/726; 361/727
(58) Field of Search ................................ 361/724–727

(56) References Cited

U.S. PATENT DOCUMENTS

| | | | |
|---|---|---|---|
| 4,686,608 A | 8/1987 | Hosking | 361/428 |
| 6,175,079 B1 * | 1/2001 | Johnston et al. | 174/50 |
| 6,419,399 B1 | 7/2002 | Loder et al. | 385/53 |
| 6,442,030 B1 | 8/2002 | Mammoser et al. | 361/727 |
| 6,462,435 B1 | 10/2002 | Covaro et al. | 307/89 |
| 6,462,958 B2 | 10/2002 | Ogata | 361/800 |
| 6,480,748 B1 | 11/2002 | Gerszberg et al. | 700/21 |
| 6,483,865 B1 | 11/2002 | Beierle | 375/130 |
| 6,487,358 B1 | 11/2002 | Gehrke et al. | 385/136 |
| 6,621,692 B1 | 9/2003 | Johnson et al. | 361/683 |

* cited by examiner

*Primary Examiner*—Yean-Hsi Chang
(74) *Attorney, Agent, or Firm*—Chapin & Huang, L.L.C.; David E. Huang, Esq.

(57) ABSTRACT

An electronic system has electronic equipment, and an electronic cabinet which houses the electronic equipment. The electronic cabinet includes a support structure which is configured to carry the electronic equipment, and a door panel which is configured to pivotally mount to the support structure. The door panel and the support structure define an opening through which a set of cables is configured to pass. The electronic cabinet further includes an assembly which is configured to manage the cables. The assembly includes a mounting bracket which is configured to mount to one of the support structure and the door panel at a location which is adjacent the opening, a section of flexible material which defines a set of grooves to hold the set of cables, and a fastener interconnected between the mounting bracket and the section of flexible material to fasten the section of flexible material to the mounting bracket.

22 Claims, 6 Drawing Sheets

METHODS AND APPARATUS FOR MANAGING A SET OF CABLES

BACKGROUND OF THE INVENTION

A typical electronic cabinet includes a frame which is designed to carry electronic equipment, and a set of panels which attaches to the frame. The set of panels, among other things, protects the electronic equipment against damage (e.g., prevents external objects from inadvertently hitting the equipment, prevents tampering, etc.) as well as protects users against injury (e.g., prevents bystanders from inadvertently coming into contact with bus bars carrying high-current power supply signals, etc.).

Some electronic cabinets have doors which open and close relative to the frames to facilitate access to the electronic equipment. The manufacturers of such cabinets typically provide openings between the doors and the frames to enable cables to pass therebetween (e.g., power cords, fiber optic communications lines, electrical signal wires, etc.).

Some manufacturers include metal within the electronic cabinet panels (i.e., the sides and doors) to decrease electromagnetic interference (EMI) emissions generated by the electronic equipment housed within the electronic cabinets. The metal functions as EMI shielding and, without such shielding, the equipment could release a substantial amount of EMI into the surrounding areas which could affect the operation of other equipment in the vicinity (e.g., the released EMI could prevent neighboring radio equipment from properly receiving communications signals, could corrupt network signals traveling through cables adjacent the backs of the equipment cabinets, etc.). Furthermore, particular agencies and committees (e.g., the FCC, ISO, ANSI, etc.) have set rudimentary standards which manufacturers must comply with, or attempt to comply with, depending upon the circumstances (e.g., depending on the application, location, zoning, etc.).

SUMMARY

Unfortunately, there are deficiencies to the above-described conventional electronic cabinets. For example, even if the manufacturers include metal within the electronic cabinet panels to decrease EMI emissions generated by the electronic equipment housed therein, the cable openings between the doors and the frames are often large enough to allow a significant amount of EMI to escape. In some instances, the existence of such openings significantly hinders the placement of electronic equipment within the electronic cabinets, i.e., manufacturers struggle to design equipment layouts that position the circuitry at interior locations away from such openings in order to maintain compliance with pre-established agency and committee standards. Accordingly, such cable openings provide weakness in the EMI shielding capabilities of electronic cabinets and can hinder placement of electronic equipment within such cabinets.

Additionally, the cables exiting the electronic cabinets (e.g., the communications leaving the openings at the top of the cabinets toward cable troughs or raceways, the lines leaving openings at the bottom of the cabinets into raise floors, etc.) are often disorganized in appearance and thus awkward to manage. As a result, technicians attempting to work on such cabinets (e.g., technicians replacing cables, running new cables, etc.) may find their tasks cumbersome and unnecessarily time consuming due to having to work around and having to sort through dangling, and perhaps tangled, cables exiting the electronic cabinets.

Furthermore, unsecured cables, which carry high speed communications signals (e.g., RF signals, digital or analog electrical signals, fiber optic signals, etc.), are often susceptible to vibration. For example, subtle but frequent movements of the cables can corrupt the communications signals passing through such cables (e.g., introduce intermittent errors) which hinder the operation of the electronic equipment housed within the electronic cabinets (e.g., can require retransmission of the signals, can invoke error checking and correction operations, etc.).

The invention is directed to cable management techniques that utilize a section of flexible material which defines a set of grooves to hold a set of cables exiting an electronic cabinet. Such a device can be manufactured at a relatively low cost, and can effectively organize the set of cables so that such cables are orderly arranged and easy to follow. Furthermore, such a device can be configured to operate as a portion of an EMI shield to reduce EMI emissions which escape from the electronic cabinet.

One embodiment of the invention is directed to an electronic system (e.g., a data storage system, a general purpose computer, etc.) having electronic equipment, and an electronic cabinet which houses the electronic equipment. The electronic cabinet includes a support structure which is configured to carry the electronic equipment, and a door panel which is configured to pivotally mount to the support structure. The door panel and the support structure define an opening through which a set of cables is configured to pass. The electronic cabinet further includes a cable management assembly. The cable management assembly includes (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket. Accordingly, the placement of the cables relative to each other, as they exit the cabinet, can be easily controlled using the assembly.

In some arrangements, the section of flexible material includes a rubberized member (e.g., a molded or routed block of rubber). At least a portion of the rubberized member is configured to block electromagnetic interference (e.g., includes embedded metallic material, is coated with metallic paint, etc.). In one arrangement, the portion of the rubberized member, which is configured to block the electromagnetic interference, is at least 0.75 inches in length. Accordingly, the combination of the support structure, the door panel and the assembly can form an EMI shield (e.g., a Faraday cage) that substantially reduces EMI emissions generated by the electronic equipment.

In some arrangements, the set of cables includes communications lines having particular thicknesses. In these arrangements, the section of flexible material defines, as the set of grooves, a series of channels having widths which are less than or equal to the particular thicknesses of the communications lines. Accordingly, the assembly is capable of operating as a strain relief (e.g., to prevent the cable ends from pulling out of their connections, to avoid kinking the of cables, etc.). Additionally, the assembly dampens movement of the cables thus reducing the likelihood of signal corruption due to cable motion.

In some arrangements, the assembly further includes a retainer arm which couples to the mounting bracket and which is configured to enclose a set of open sides of the set of grooves. Accordingly, a user can close the retainer arm over the section of flexible material to lock the set of cables in place within the set of grooves.

In one arrangement, the assembly further includes a hinge which pivotally couples a first end of the retainer arm to the mounting bracket, and a thumbscrew which is configured to selectively (i) connect a second end of the retainer arm to the mounting bracket and (ii) disconnect the second end of the retainer arm from the mounting bracket. In this arrangement, the hinge and the thumbscrew enable the user to selectively open and close the retainer arm (i.e., by operating the thumbscrew and the arm) when adding a cable, removing a cable or simply reorganizing the positions of one or more cables within the assembly.

In one arrangement, the location adjacent the opening resides along a top edge of the door panel when the door panel is in a closed position relative to the support structure. This arrangement is well-suited for managing the cables when the cables extend from cabinet up to a cable raceway or trough along the ceiling.

The features of the invention, as described above, may be employed in electronic systems, devices and methods such as those of EMC Corporation of Hopkinton, Ma.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for managing a set of cables utilizing a section of flexible material which defines a set of grooves to hold a set of cables exiting an electronic cabinet. The section of flexible material (e.g., molded or routed rubber) can be manufactured at a relatively low cost, and can effectively organize the set of cables so that such cables are orderly arranged and easy to handle. Furthermore, the flexible material can be provided with a metallic component (e.g., integrated/embedded metallic material, a metallic coating, etc.) to operate as a portion of an electromagnetic interference (EMI) shield with other portions of the electronic cabinet (e.g., to form a portion of a Faraday cage).

Figure 1:
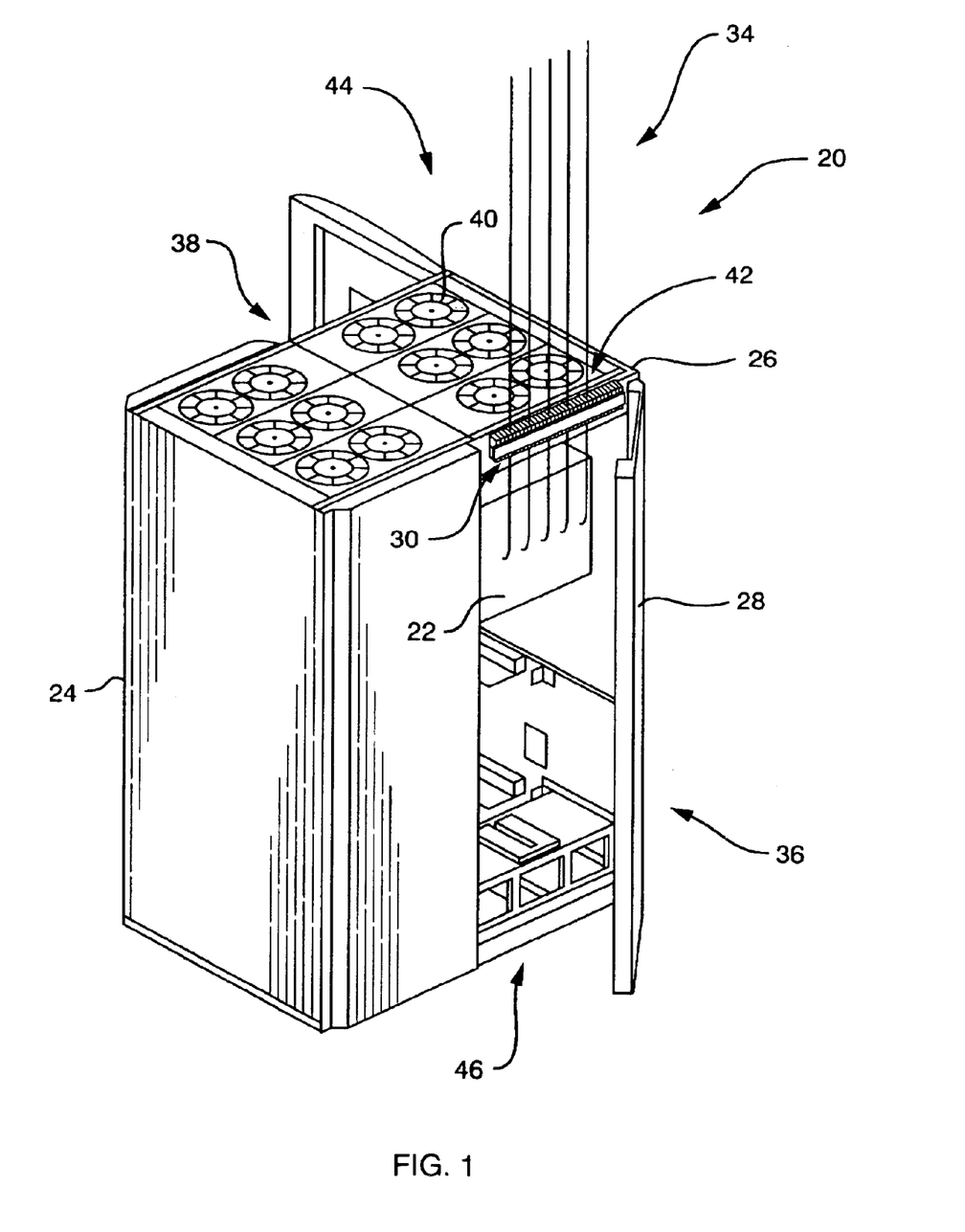
FIG. 1 is a perspective view of an electronic system which is suitable for use by the invention when a door panel of the electronic system is in an open position.
Figure 2:
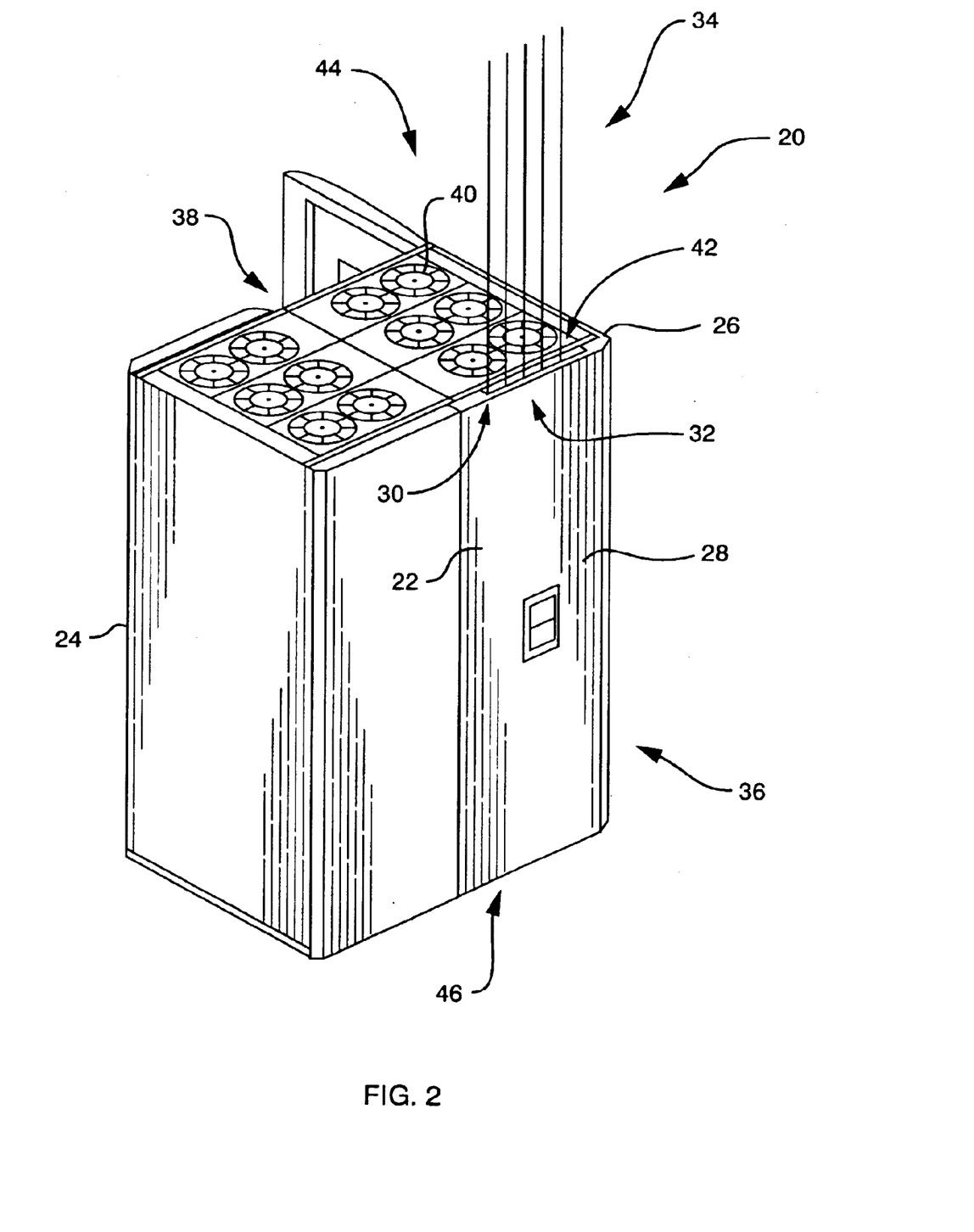
FIG. 2 is a perspective view of the electronic system of FIG. 1 when the door panel of the electronic system is in a closed position.

FIGS. 1 and 2 show an electronic system 20 which is suitable for use by the invention. The electronic system 20 includes electronic equipment 22, and an electronic cabinet 24 which houses the electronic equipment 22. The electronic cabinet 24 includes, among other things, a support structure 26 (e.g., a frame), a door panel 28 and a cable management assembly 30. The support structure 26 is configured to support the electronic equipment 22. The door panel 28 pivotally mounts to the support structure 26 and is movable between an opened position (FIG. 1) and a closed position (FIG. 2) relative to the support structure 26 to selectively provide a user with access to the electronic equipment 22. When the door panel 28 is in the closed position, the support structure 26 and the door panel 28 define an opening 32 through which a set of cables 34 is configured to pass. By way of example only, the door panel 28 mounts to a back 36 of the support structure 26. It should be understood that the support structure 26 also has a front 38 that provides the user with additional access to the electronic equipment 22 (e.g., through another door panel). Also, by way of example only, the electronic system 20 further includes a fan assembly 40 that generates an air stream within the cabinet 24 that removes heat from the electronic equipment 22 during operation.

As shown in FIGS. 1 and 2, the cable management assembly 30 is configured to manage the set of cables 34 in an orderly manner. By way of example, the set of cables 34 extends from the electronic equipment 22 and out the top 44 of the electronic cabinet 24 (e.g., to a cable trough or raceway in the ceiling). A similar cable management assembly 30 and another opening 32 (FIG. 2) can be positioned at the bottom 46 of the electronic cabinet 24 to manage cables 34 exiting from the bottom 46 (e.g., into a raised floor cavity). As will be described in further detail shortly, the cable management system 30 is configured to hold the cables 34 in a row for easy maneuverability and handling. Accordingly, the user can easily follow and access the cables 34 (e.g., the user does not need to chaotically sort through a tangled web of cables as in conventional electronic cabinets). Further details of the cable management assembly 30 will now be provided with reference to FIGS. 3 and 4.

Figure 3:
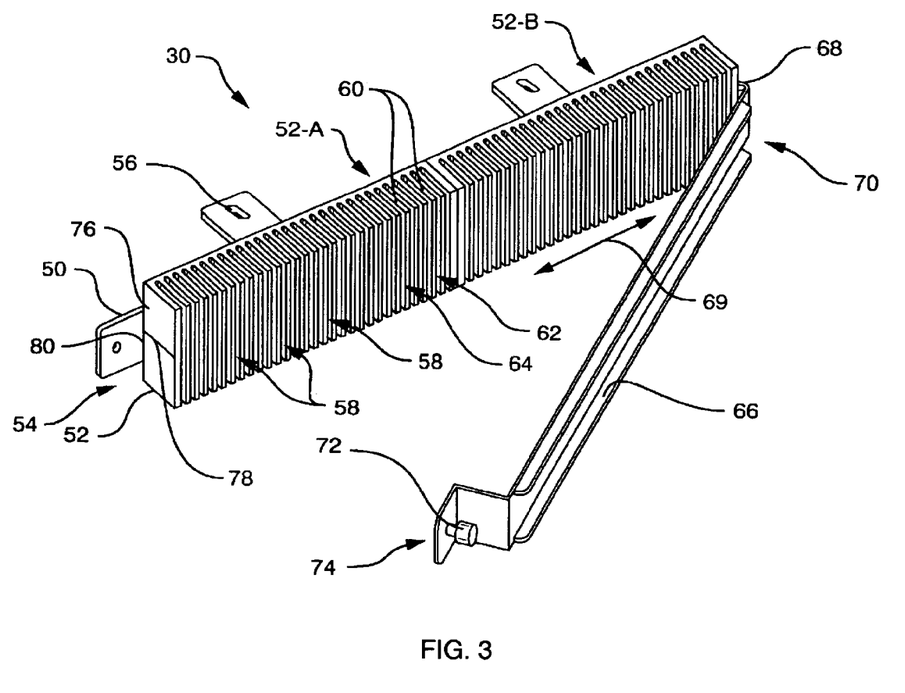
FIG. 3 is a perspective view of a cable management assembly of the electronic system of FIGS. 1 and 2.
Figure 4:
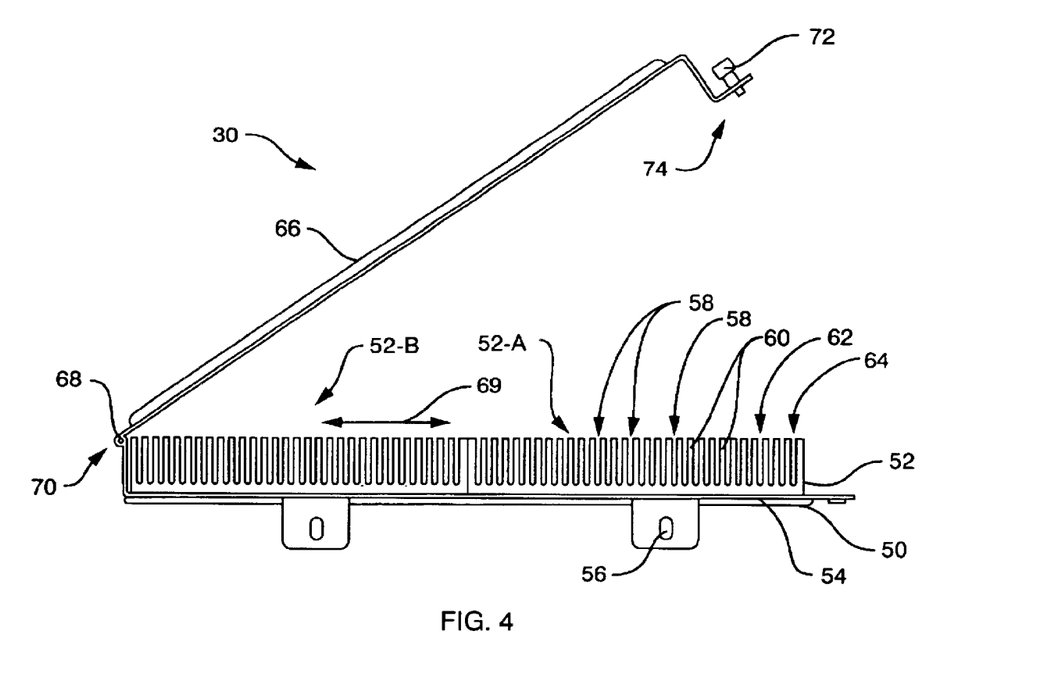
FIG. 4 is a top view of the cable management assembly when a retainer arm of the cable management assembly is in an open position.

FIG. 3 shows a detailed perspective view of the cable management assembly 30, and FIG. 4 shows a top view of the cable management assembly 30. As shown in FIGS. 3 and 4, the cable management assembly 30 includes a mounting bracket 50, a section of flexible material 52 and fastener 54. The mounting bracket 50 is configured to mount to the support structure 26 at a location 42 (also see FIGS. 1 and 2) which is adjacent the opening 32 that is formed by the support structure 26 and the door panel 28 when the door panel 28 is in the closed position relative to the support structure 26 (FIG. 2). In particular, the mounting bracket 50 of the cable management assembly 30 defines holes 56 through which hardware (e.g., screws, bolts, posts from the support structure 26, etc.) passes in order to attach the cable management assembly 30 to the cabinet support structure 26 (also see FIG. 1). The section of flexible material 52 defines a set of grooves 58 to hold the set of cables 34. The fastener 54 is interconnected between the mounting bracket 50 and the section of flexible material 52 and fastens the section of flexible material 52 to the mounting bracket 50.

As shown in FIGS. 3 and 4, the section of flexible material 52 defines, as the set of grooves 58, a series of elongated channels or slots into which the user can insert or pull out the cables 34. That is, the flexible material 52 defines finger portions 60 which extend in a substantially parallel manner to define the set of grooves 58. In one arrangement (also see FIG. 4), the finger portions 60 have flanged ends 62 which make the grooves 58 slightly narrower at the groove ends 64 in order to better retain the cables 34 once the user has inserted the cables 34 into the grooves 58.

As further shown in FIGS. 3 and 4, the cable management assembly 30 further includes a retainer arm 66, a hinge 68 at one end 70 of the retainer arm 66, and a thumbscrew 72 at another end 74 of the retainer arm 66. The user is capable of operating the thumbscrew 72 and pivoting the retainer arm 66 about the hinge 68 to selectively close the retainer arm 66 to lock the cables 34 within the grooves 58 (also see FIG. 1), or open the retainer arm 68 (FIGS. 3 and 4) to unlock the cables 34 from the grooves 58. Such operation provides the user with an additional cable management feature of more rigidly securing the cables 34 within the grooves 58, i.e., the cables 34 cannot be removed from the cable management assembly 30 without operating the thumbscrew 72 and opening the retainer arm 66.

As mentioned above, the cable management assembly 30 is configured to manage the set of cables 34 in an organized manner. In one arrangement, the grooves 58 reside in a row 68 (FIGS. 3 and 4) within the section of flexible material 52 thus enabling the user to organize the cables 34 in a corresponding row (FIGS. 1 and 2). Accordingly, the user can easily follow and access the cables 34 (e.g., the user is not overburdened by having to sort through a disorganized mesh of cables as is common in conventional electronic cabinets). Further details of the invention will now be provided with reference back to FIG. 2.

As explained earlier, FIG. 2 shows a perspective view of the electronic system 20 when the door panel 28 resides in a closed position against the support structure 26. In this orientation, the door panel 28 and the support structure 26 define the opening 32. As shown, the section of flexible material 52 substantially covers the opening 32. Although the grooves 58 of the flexible material section 40 are substantially parallel and point through the opening 32 to hold and guide the cables 34 through the opening 32 (also see FIGS. 3 and 4), the flexible material section 40 reduces the size of the opening 32. This inhibits air from passing through the opening 32 and thus promotes the proper airflow through the interior of the cabinet 24 (e.g., thus preventing air of the air stream generated by the fan assembly 40 from leaking into or out of the opening 32).

Additionally, as will be explained in further detail shortly, the section of flexible material 52 includes metallic material 76 (FIG. 3) that operates as an EMI shield to prevent passage of EMI signals. That is, the metallic portion of the flexible material section 52 is thick (i.e., deep) enough so that the EMI signals do not significantly pass through the grooves 58. Accordingly, when the support structure 26 and the door panel 28 also include metallic material (e.g., sheet metal, a metallic coating, etc.), the combination of the support structure 26, the door panel 28 and the section of flexible material 52 of the cable management assembly 30 form a substantially contiguous EMI barrier (e.g., a Faraday cage) to reduce EMI emissions which emanate from the electronic equipment 22 during operation. That is, the various components 26, 28, 52 (among other things) operate to block EMI signals generated by the electronic equipment 22 from escaping the cabinet 24 (FIG. 2).

In one arrangement, the flexible material section 52 includes non-conductive elastomeric material (e.g. rubber), and conductive material (e.g., metal) which is suspended within the non-conductive elastomeric material so that the resulting combination becomes conductive and operates as an EMI barrier. In another arrangement, the flexible material section 52 includes non-conductive elastomeric material with a conductive coating (e.g., a metallic coating applied over the surface of the non-conductive elastomeric material). In yet another arrangement, the flexible material section 52 is a combination of conductive rubber with a conductive coating. In one arrangement, the conductive portion of the flexible material section 52 is at least 0.75 inches deep.

It should be understood that, when the flexible material section 52 is conductive in order to function as an EMI barrier, the flexible material section 52 is preferably in electrical communication with chassis ground. That is, the flexible material section 52 preferably contacts other conductive portions of the electronic cabinet 24 (e.g., metal of the support structure 26) which is grounded. Accordingly, the flexible material section 52 forms, in combination with other portions of the electronic system 20, a robust and cohesive EMI shield to reduce EMI emissions. Further details of the invention will now be provided with reference to FIG. 5.

Figure 5:
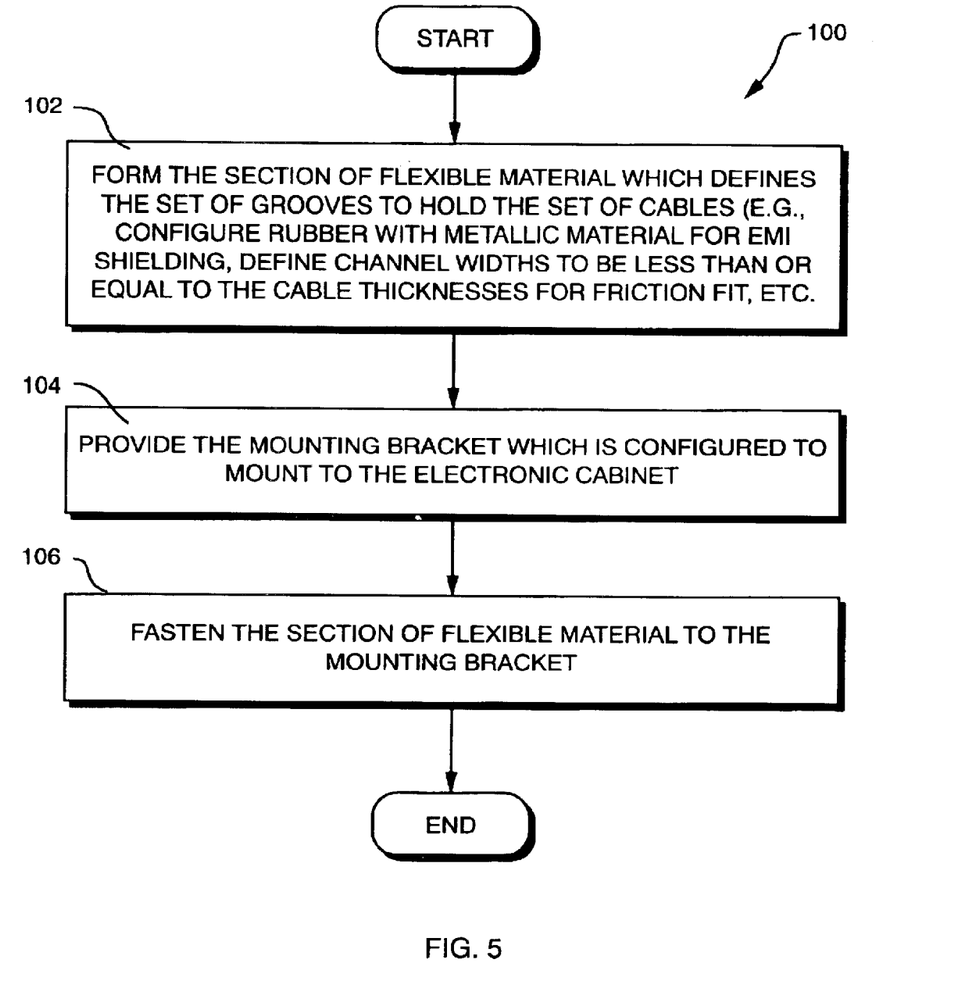
FIG. 5 is a flowchart of a procedure for making the cable management assembly of FIGS. 3 and 4.

FIG. 5 is a flowchart of a procedure 100 which is performed by the manufacturer of the electronic system 20 when making the cable management assembly 30 with EMI protection. In step 102, the manufacturer forms the section of flexible material 52 which defines the set of grooves 58 to hold the set of cables 34 (also see FIGS. 1 through 4). The manufacturer constructs the section of flexible material 52 with at least a depth that significantly inhibits the passage of EMI signals generated by the electronic equipment 22 (e.g., a depth of substantially 0.75 inches for the portion having the metallic material 76 when the grooves 58 are sized for standard fiber optic cable thicknesses). The manufacturer selects the depth of the metallic material 76 (FIG. 3) so that the cable management assembly 30 provides adequate EMI shielding (i.e., there is better EMI protection as the depth of the metallic portion increases since a wider range of signals will be prevented from escaping through the flexible material section 52 as it's metallic portion deepens). By way of example only, the line 78 in FIG. 3 delineates metallic material 76 and non-metallic material 80 of the section of flexible material 52. In some arrangements, the manufacturer configures, as the section of flexible material 52, a rubberized member with at least a portion that is configured to block EMI signals (e.g., molds or cuts a rubber block into shape). In one arrangement, the manufacturer forms the rubberized member with integrated metallic material 76 (e.g., embedded metal or metallic fabric). In another arrangement, the rubberized member is initially non-metallic, and the manufacturer coats at least a portion of the rubberized member with a metallic coating (e.g., dips the rubberized member in metallic liquid material, sprays metallic paint over the rubberized member, etc.).

In step 104, the manufacturer provides the mounting bracket 50 which is configured to mount to the support structure 26 of the electronic cabinet 24. In one arrangement, the manufacturer forms the mounting bracket 50 from stock metal (e.g., cuts the metal, bends the metal, molds the metal, welds metal parts together, etc.).

In step 106, the manufacturer fastens the section of flexible material 52 to the mounting bracket 50. In one arrangement, the manufacturer applies, as the fastener 54 (also see FIGS. 3 and 4), a layer of adhesive (e.g., glue, epoxy, etc.) between the section of flexible material 52 and the mounting bracket 50. In another arrangement, the manufacturer uses a non-adhesive type material to fasten the section of flexible material 52 and the mounting bracket 50 together (e.g., hardware, double-sided tape, etc.).

The manufacturer can attach the retaining arm 66 with the associated hinge 68 and thumbscrew 72 either as a subsequent step (i.e., after step 106) or during step 104 (e.g., the manufacturer obtains or out-sources the mounting bracket 50 and the retaining arm 66 as a pre-assembled item).

The resulting cable management system 30 is well-suited for mounting to an electronic cabinet 24 and for managing a set of cables 34. It should be understood that the cables 34 can be one or many of a variety of cable types such as power cords, electrical communications wires (e.g., digital signal buses, analog signal lines, etc.), fiber optic cables, etc. Such lines can come in a variety of thicknesses. In one arrangement, the manufacturer forms the set of grooves 58 such that the channels are elongated and the channel widths are less than or equal to the particular thicknesses of the cables 34. That is, the manufacturer sizes the width of each groove 58 to provide a friction fit for the type of cable 34 to be placed within that groove 58. Accordingly, the section of flexible material 52 tends to hold the cables 34 in place with a slight grip, and thus (i) operates as a mechanism for securing the cables 34 with minimal motion, (ii) provides strain relief that hinders the cables 34 from being pulled out of connection with the electronic equipment 22, and (iii) hinders kinking (i.e., the elongated channels hold the cables 34 in a stable manner without forcing the cables 34 into awkward bend angles). Further details of the invention will now be provided with reference to FIG. 6.

Figure 6:
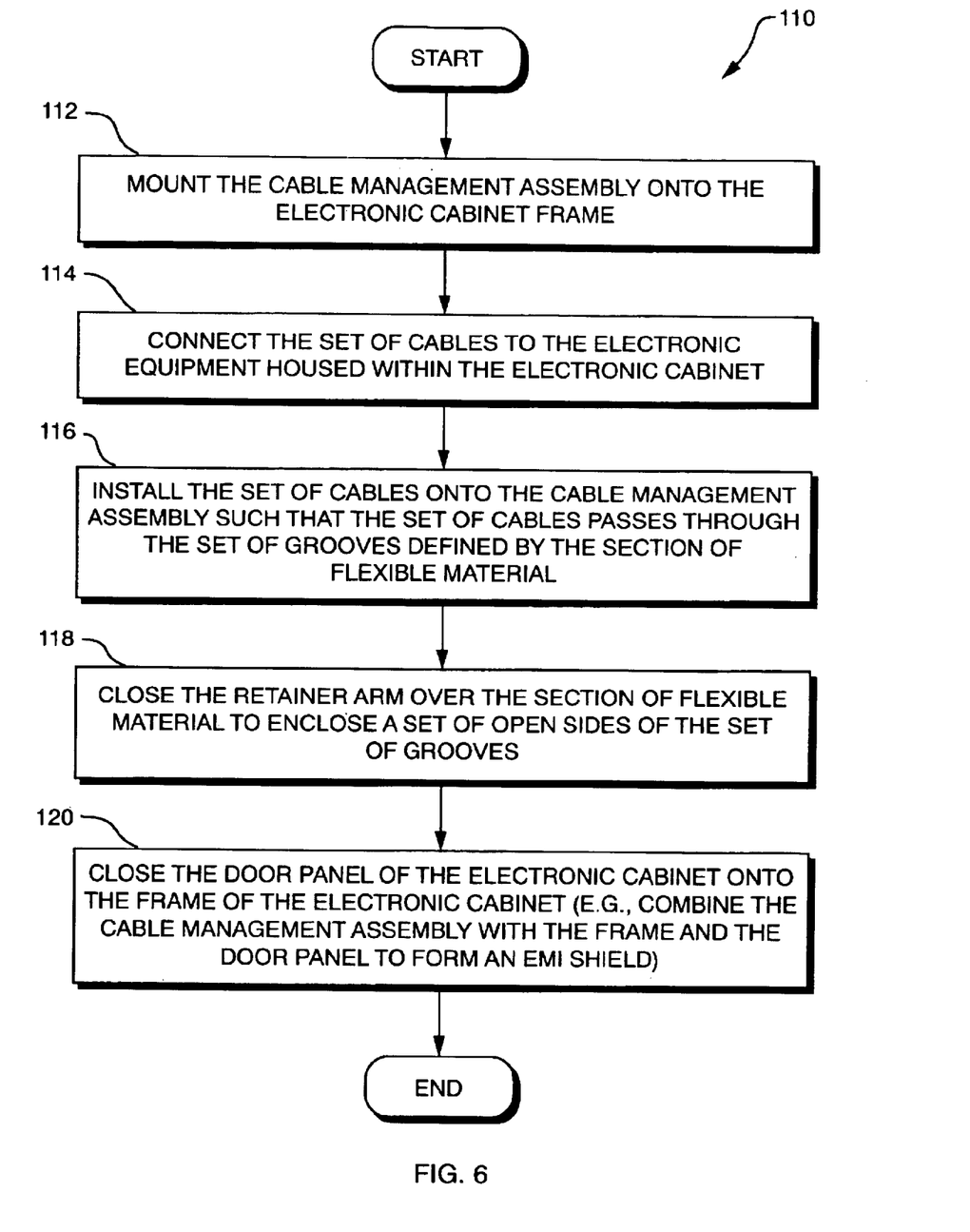
FIG. 6 is a flowchart of a procedure for mounting the cable management assembly of FIGS. 3 and 4 to an electronic cabinet.

FIG. 6 shows a flowchart of a procedure 110 for managing a set of cables 34 which is performed by a user of the cable management assembly 30. In step 112, the user mounts the cable management assembly 30 onto the support structure 26 of the electronic cabinet 24. When the cable management assembly 30 is properly installed, the set of grooves 58 defined by the section of flexible material 52 aligns with the opening 32 (see FIG. 2). In one arrangement, the flexible material section 52 includes a conductive portion (e.g., the section 52 is conductive for at least 0.75 inches) which, when mounted onto the support structure 26, makes electrical contact with chassis ground within the support structure 26 (e.g., through metallic hardware which mounts the cable management assembly 30 to the support structure 26) to form part of an EMI shield.

In step 114, the user connects the set of cables 34 to the electronic equipment 22 housed within the electronic cabinet 24. For example, the user connects an end of a cable 46 into a connector of the electronic equipment 22, an end of another cable 46 into another connector, and so on.

In step 116, the user installs the set of cables 34 into the cable management assembly 30 such that the set of cables 34 passes through the set of grooves 58 defined by the section of flexible material 52. In one arrangement, the widths of the grooves 58 are no larger than the cable diameters. Since the widths of the grooves 58 are less than or equal to the thicknesses of the cables 34, each cable 46 encounters a friction fit within a corresponding groove 46.

In step 118, the user closes the retainer arm 66 over the section of flexible material 52 to enclose a set of open sides of the set of grooves 58. In particular, the user closes the retainer arm 66 about the hinge 68, and then turns the thumbscrew 72 to secure the retainer arm 66 in place over the section of flexible material 52 (FIGS. 3 and 4). At this point, the user has locked the cables 34 in the grooves 58 of the section of flexible material 52.

In step 120, the user closes the door panel 28 onto the support structure 26 of the electronic cabinet 24 (FIG. 2). In the arrangement where the section of flexible material 52 includes a rubberized member with metallic material 76 (FIG. 3), the cable management assembly 30 forms, in combination with the door panel 28 and the support structure 26, an EMI shield that reduces emissions of EMI signals from the electronic equipment 22.

It should be understood that the user is capable of completing step 114 before beginning step 116. Alternatively, the user performs steps 114 and 116 concurrently. In this alternative, the user connects an end of a cable 46, and then inserts that cable 46 into a groove 46. Next, the user connects an end of another cable 46, inserts that other cable 46 into another groove 46, and so on.

It should be further understood that the section of flexible material 52 of the cable management assembly 30 can hold more than one cable 46 in each groove 46. For example, if there is a high density of cables 34, the section of flexible material 52 is capable of holding multiple cables 34 within each groove 46.

As described above, the invention is directed to techniques for managing a set of cables 34 utilizing a section of flexible material 52 which defines a set of grooves 58 to hold a set of cables 34 exiting an electronic cabinet 24. The section of flexible material 52 (e.g., molded or cut/drilled rubber) can be manufactured at a relatively low cost, and can effectively organize the set of cables 34 so that such cables 34 are orderly arranged and easy to handle. Additionally, the flexible material 52 is capable of being equipped with a metallic material 76 (e.g., integrated metallic material, a metallic coating, etc.) to operate as a portion of an EMI shield with other portions of the electronic cabinet 24 (e.g., to form a portion of a Faraday cage).

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the mounting bracket 50 of the cable management system 30 was described above as mounting to the support structure 26 by way of example only. In other arrangements, the mounting bracket 50 is configured to mount to the door panel 28.

Additionally, it should be understood that the cable management system 30 was described above as mounting to a location 42 near the top 44 of the electronic cabinet 24 (e.g., to guide the cables 34 from the cabinet 24 toward a raceway in the ceiling) by way of example only. In other arrangements, the cable management system 30 mounts to other locations such as near the bottom 46 of the cabinet 24 (e.g., to guide the cables 34 into a raise floor cavity), out a side of the cabinet 24 (e.g., to guide the cables 34 toward another cabinet 24), etc.

Furthermore, it should be understood that the cable management assemblies 30 are capable of including more than one section of flexible material 52. By way of example only, the cable management assembly 30 shown in FIGS. 3 and 4 includes two flexible material sections 52-A, 52-B to provide the manufacturer additional manufacturing flexibility (e.g., to reduce manufacturing costs, to simplify production of the flexible material sections 52, to improve manufacturing yields, etc.).

What is claimed is:

1. An electronic system, comprising:
   electronic equipment; and
   an electronic cabinet which houses the electronic equipment, the electronic cabinet including:
   a support structure which is configured to carry the electronic equipment, a door panel which is configured to pivotally mount to the support structure, the door panel and the support structure defining an opening through which a set of cables is configured to pass, and an assembly which is configured to manage the set of cables, the assembly including (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket, the location residing along a top edge of the door panel when the door panel is in a closed position relative to the support structure.

2. The electronic system of claim 1 wherein the section of flexible material is configured to compress against the set of cables for a friction fit when the set of cables are held within the set of grooves.

3. The electronic system of claim 1 wherein the section of flexible material of the assembly is elongated in shape to define a long axis, wherein the section of flexible material defines the set of grooves in a row along the long axis, and wherein the section of flexible material is configured to hold the set of cables in a direction which is substantially perpendicular to the long axis.

4. An electronic cabinet, comprising:

a support structure which is configured to carry electronic equipment;

a door panel which is configured to pivotally mount to the support structure, the door panel and the support structure defining an opening through which a set of cables is configured to pass; and an assembly which is configured to manage the set of cables, the assembly including (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket, the section of flexible material being configured to compress against the set of cables for a friction fit when the set of cables are held within the set of grooves.

5. The electronic cabinet of claim 4 wherein the section of flexible material of the assembly is elongated in shape to define a long axis, wherein the section of flexible material defines the set of grooves in a row along the long axis, and wherein the section of flexible material is configured to hold the set of cables in a direction which is substantially perpendicular to the long axis.

6. An electronic cabinet, comprising:

a support structure which is configured to carry electronic equipment;

a door panel which is configured to pivotally mount to the support structure, the door panel and the support structure defining an opening through which a set of cables is configured to pass; and an assembly which is configured to manage the set of cables, the assembly including (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket, wherein the section of flexible material includes:

a rubberized member, at least a portion of which is configured to block electromagnetic interference.

7. The electronic cabinet of claim 6 wherein the portion of the rubberized member, which is configured to block the electromagnetic interference, is at least 0.75 inches in length.

8. An electronic cabinet, comprising:

a support structure which is configured to carry electronic equipment;

a door panel which is configured to pivotally mount to the support structure, the door panel and the support structure defining an opening through which a set of cables is configured to pass; and an assembly which is configured to manage the set of cables, the assembly including (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket, wherein the set of cables includes communications lines having particular thicknesses; and wherein the section of flexible material defines, as the set of grooves, channels having widths which are less than or equal to the particular thicknesses of the communications lines.

9. An electronic cabinet, comprising:

a support structure which is configured to carry electronic equipment;

a door panel which is configured to pivotally mount to the support structure, the door panel and the support structure defining an opening through which a set of cables is configured to pass;

an assembly which is configured to manage the set of cables, the assembly including (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket; and a retainer arm which couples to the mounting bracket and which is configured to enclose a set of open sides of the set of grooves.

10. The electronic cabinet of claim 9, further comprising:

a hinge which pivotally couples a first end of the retainer arm to the mounting bracket; and a thumbscrew which is configured to selectively connect a second end of the retainer arm to the mounting bracket and disconnect the second end of the retainer arm from the mounting bracket.

11. An electronic cabinet, comprising:

a support structure which is configured to carry electronic equipment;

a door panel which is configured to pivotally mount to the support structure, the door panel and the support structure defining an opening through which a set of cables is configured to pass; and an assembly which is configured to manage the set of cables, the assembly including (i) a mounting bracket which is configured to mount to one of the support structure and the door panel at a location which is adjacent the opening, (ii) a section of flexible material which defines a set of grooves to hold the set of cables, and (iii) a fastener interconnected between the mounting bracket and the section of flexible material to fasten the section of flexible material to the mounting bracket, wherein the location resides along a top edge of the door panel when the door panel is in a closed position relative to the support structure.

12. An assembly for managing a set of cables exiting an electronic cabinet, the assembly comprising:

a mounting bracket which is configured to mount to the electronic cabinet;

a section of flexible material which defines a set of grooves to hold the set of cables; and a fastener interconnected between the mounting bracket and the section of flexible material to fasten the section of flexible material to the mounting bracket, the section of flexible material being configured to compress against the set of cables for a friction fit when the set of cables are held within the set of grooves.

13. The assembly of claim 12 wherein the section of flexible material is elongated in shape to define a long axis, wherein the section of flexible material defines the set of grooves in a row along the long axis, and wherein the section of flexible material is configured to hold the set of cables in a direction which is substantially perpendicular to the long axis.

14. An assembly for managing a set of cables exiting an electronic cabinet, the assembly comprising:

a mounting bracket which is configured to mount to the electronic cabinet;

a section of flexible material which defines a set of grooves to hold the set of cables; and a fastener interconnected between the mounting bracket and the section of flexible material to fasten the section of flexible material to the mounting bracket, wherein the section of flexible material includes:

a rubberized member, at least a portion of which is configured to block electromagnetic interference.

15. The assembly of claim 14 wherein the portion of the rubberized member, which is configured to block the electromagnetic interference, is at least 0.75 inches in length.

16. An assembly for managing a set of cables exiting an electronic cabinet, the assembly comprising:

a mounting bracket which is configured to mount to the electronic cabinet;

a section of flexible material which defines a set of grooves to hold the set of cables; and a fastener interconnected between the mounting bracket and the section of flexible material to fasten the section of flexible material to the mounting bracket, wherein the set of cables includes communications lines having particular thicknesses; and wherein the section of flexible material defines, as the set of grooves, channels having widths which are less than or equal to the particular thicknesses of the communications lines.

17. An assembly for managing a set of cables exiting an electronic cabinet, the assembly comprising:

a mounting bracket which is configured to mount to the electronic cabinet;

a section of flexible material which defines a set of grooves to hold the set of cables;

a fastener interconnected between the mounting bracket and the section of flexible material to fasten the section of flexible material to the mounting bracket; and a retainer arm which couples to the mounting bracket and which is configured to enclose a set of open sides of the set of grooves.

18. The assembly of claim 17, further comprising:

a hinge which pivotally couples a first end of the retainer arm to the mounting bracket; and a thumbscrew which is configured to selectively connect a second end of the retainer arm to the mounting bracket and disconnect the second end of the retainer arm from the mounting bracket.

19. A method for making a cable management assembly for an electronic cabinet, the method comprising:

forming a section of flexible material which defines a set of grooves to hold a set of cables;

providing a mounting bracket which is configured to mount to the electronic cabinet; and fastening the section of flexible material to the mounting bracket, wherein forming the section of flexible material involves:

configuring, as the section of flexible material, a rubberized member with at least a portion that is configured to block electromagnetic interference.

20. A method for making a cable management assembly for an electronic cabinet, the method comprising:

forming a section of flexible material which defines a set of grooves to hold a set of cables;

providing a mounting bracket which is configured to mount to the electronic cabinet; and fastening the section of flexible material to the mounting bracket, wherein the set of cables includes communications lines having particular thicknesses, wherein the section of flexible material includes a rubberized member, and wherein forming the section of flexible material involves:

creating, as the set of grooves, channels within the rubberized member, the channels having widths which are less than or equal to the particular thickness of the communications lines.

21. A method for managing a set of cables, the method comprising:

mounting a cable management assembly onto an electronic cabinet, the cable management assembly including a section of flexible material which defines a set of grooves to hold a set of cables;

connecting the set of cables to electronic equipment housed within the electronic cabinet;

installing the set of cables into the cable management assembly such that the set of cables passes through the set of grooves defined by the section of flexible material; and closing a retainer arm over the section of flexible material to enclose a set of open sides of the set of grooves.

22. A method for managing a set of cables, the method comprising:

mounting a cable management assembly onto an electronic cabinet, the cable management assembly including a section of flexible material which defines a set of grooves to hold a set of cables, wherein the section of flexible material includes a rubberized member, at least a portion of which is configured to block electromagnetic interference;

connecting the set of cables to electronic equipment housed within the electronic cabinet;

installing the set of cables into the cable management assembly such that the set of cables passes through the set of grooves defined by the section of flexible material; and closing a door panel of the electronic cabinet onto a support structure of the electronic cabinet to form an electromagnetic interference shield from a combination of the support structure, the door panel and the portion of the rubberized member which is configured to block electromagnetic interference.

\* \* \* \* \*

UNITED STATES PATENT AND TRADEMARK OFFICE
CERTIFICATE OF CORRECTION

PATENT NO. : 6,791,841 B1
DATED : September 14, 2004
INVENTOR(S) : Paul T. Tirrell, Ralph L. Specht, Jr. and Gary Goulet It is certified that error appears in the above-identified patent and that said Letters Patent is hereby corrected as shown below:

Title page,
Item [75], Inventors, "Paul T. Tirrell, Uxbridge, MA (US); Ralph L. Specht, Jr., Westborough, MA (US)" should read -- Paul T. Tirrell, Uxbridge, MA (US); Ralph L. Specht, Jr., Westborough, MA (US); Gary Goulet, Pascoag, RI (US) --.

Signed and Sealed this

Ninth Day of August, 2005

JON W. DUDAS
*Director of the United States Patent and Trademark Office*